United States Patent
Jiang et al.

(10) Patent No.: US 9,614,173 B2
(45) Date of Patent: Apr. 4, 2017

(54) PACKAGING METHOD FOR ELECTRONIC DEVICE AND PACKAGING SYSTEM

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Zhiliang Jiang, Beijing (CN); Minghua Xuan, Beijing (CN); Fengli Ji, Beijing (CN); Bo Zhang, Beijing (CN); Fei Chen, Beijing (CN); Renrong Gai, Beijing (CN)

(73) Assignees: BOE TECHNOLOGY GROUP CO., LTD., Beijing (CN); ORDOS YAUNSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 14/913,090

(22) PCT Filed: Jul. 16, 2015

(86) PCT No.: PCT/CN2015/084212
§ 371 (c)(1),
(2) Date: Feb. 19, 2016

(87) PCT Pub. No.: WO2016/150033
PCT Pub. Date: Sep. 29, 2016

(65) Prior Publication Data
US 2017/0047538 A1    Feb. 16, 2017

(30) Foreign Application Priority Data
Mar. 20, 2015  (CN) .......................... 2015 1 0126298

(51) Int. Cl.
*H01L 51/52*    (2006.01)
*H01L 23/00*    (2006.01)
*H01L 51/56*    (2006.01)

(52) U.S. Cl.
CPC ............ *H01L 51/52* (2013.01); *H01L 23/562* (2013.01); *H01L 51/56* (2013.01); *H01L 2251/105* (2013.01)

(58) Field of Classification Search
CPC ........ H01L 23/562; H01L 51/52; H01L 51/56
See application file for complete search history.

(56) References Cited

U.S. PATENT DOCUMENTS

2005/0196969 A1*  9/2005  Gunner ............... H01L 51/0005
                                        438/725
2005/0269940 A1* 12/2005  Nishikawa .......... H01L 51/5246
                                        313/500

(Continued)

FOREIGN PATENT DOCUMENTS

CN       1665355 A     9/2005
CN       1951154 A     4/2007

(Continued)

OTHER PUBLICATIONS

1st office action issued in corresponding Chinese application No. 201510126298.5 dated Jun. 20, 2016.

(Continued)

*Primary Examiner* — Allan R Wilson
(74) *Attorney, Agent, or Firm* — Nath, Goldberg & Meyer; Joshua B. Goldberg

(57) ABSTRACT

The present invention provides a packaging method for an electronic device, which includes a step of forming a packaging substrate, the step of the forming a packaging substrate includes: forming, on a base substrate, a defining pattern which comprises a groove for defining position of frit; providing colloidal frit in the groove; presintering the (Continued)

colloidal frit to obtain preliminarily cured frit; polishing upper surfaces of the defining pattern and the preliminarily cured frit; and removing the defining pattern, and completely curing the preliminarily cured frit, so as to form solid frit on the base substrate. The present invention also provides a packaging system. By using the packaging method provided by the present invention, a better packaging effect can be achieved.

20 Claims, 2 Drawing Sheets

(56) References Cited

U.S. PATENT DOCUMENTS

| 2007/0105396 A1* | 5/2007 | Li | B82Y 10/00 |
|---|---|---|---|
| | | | 438/758 |
| 2007/0128967 A1* | 6/2007 | Becken | H01L 51/5246 |
| | | | 445/25 |
| 2009/0275188 A1* | 11/2009 | Park | H01L 45/06 |
| | | | 438/478 |
| 2011/0121714 A1 | 5/2011 | Kim et al. | |
| 2014/0329354 A1* | 11/2014 | Defranco | H01L 51/56 |
| | | | 438/82 |
| 2014/0353005 A1 | 12/2014 | Nair et al. | |

FOREIGN PATENT DOCUMENTS

| CN | 101536133 A | 9/2009 |
|---|---|---|
| CN | 101882548 A | 11/2010 |
| CN | 102471140 A | 5/2012 |
| CN | 102484216 A | 5/2012 |
| CN | 102515534 A | 6/2012 |
| CN | 104332450 A | 2/2015 |
| CN | 104716275 A | 6/2015 |

OTHER PUBLICATIONS

ISR issued in International application No. PCT/CN2015/084212 dated Dec. 21, 2015.

* cited by examiner

PACKAGING METHOD FOR ELECTRONIC DEVICE AND PACKAGING SYSTEM

CROSS-REFERENCES TO RELATED APPLICATIONS

This is a National Phase Application filed under 35 U.S.C. 371 as a national stage of PCT/CN2015/084212, filed Jul. 16, 2015, an application claiming the benefit of Chinese Application No. 201510126289.5, filed to State Intellectual Property Office of the People's Republic of China on Mar. 20, 2015, the entire content of which is incorporated by reference herein.

FIELD OF THE INVENTION

The present invention relates to the manufacturing field of electronic devices, in particular to a packaging method for an electronic device and a packaging system executing the packaging method.

BACKGROUND OF THE INVENTION

An organic light emitting diode (OLED) is one of the electronic devices that need to be packaged before they can be used, it is well known that an OLED device is very sensitive to moisture and oxygen in the environment, and moisture and oxygen can deteriorate performance of the OLED device. If an OLED device is sealed in a moisture and oxygen-free environment, the lifespan of the OLED device may be significantly elongated. Therefore, packaging technique for OLED device has become a key processing procedure for improving the lifespan of an OLED device.

In a traditional rigid packaging, UV curing adhesive and frit are main materials that are commonly used as sealant.

Currently, in general, frit is deposited on a packaging glass by way of screen printing, then the packaging glass is assembled with a substrate on which an OLED device is formed, and subsequently the frit is cured.

However, the OLED device obtained by using the above method is prone to have a crack at the position where the sealant (frit) is, which causes a failure of the OLED device.

Therefore, how to prevent an OLED device from having a crack at the position where the sealant is becomes a technical problem to be solved urgently in the field.

SUMMARY OF THE INVENTION

An object of the present invention is to provide a packaging method for an electronic device and a packaging system executing the packaging method. An electronic device obtained by using the packaging method can hardly have a crack at a packaging position.

To achieve the above object, as one aspect of the present invention, there is provided a packaging method for an electronic device, wherein the packaging method includes a step of forming a packaging substrate, and the step of forming a packaging substrate includes sub-steps:

forming a defining pattern on a base substrate, wherein the defining pattern includes a groove for defining position of frit;
providing colloidal frit in the groove;
presintering the colloidal frit to obtain preliminarily cured frit;
polishing upper surfaces of the defining pattern and the preliminarily cured frit; and
removing the defining pattern to form solid fit on the base substrate, so that the packaging substrate is obtained.

Preferably, the sub-step of forming a defining pattern on a base substrate includes:

coating a layer of photoresist on the base substrate; and
exposing and developing the photoresist, so as to obtain the defining pattern.

Preferably, material for forming the defining pattern maintains solid without being denatured when presintering the colloidal frit, and maintains solid during polishing.

Preferably, the presintering is performed at a temperature of 100° C. to 120° C.

Preferably, the sub-step of removing the defining pattern to form solid frit on the base substrate includes:

stripping off the defining pattern; and
performing secondary sintering on the preliminarily cured frit, so as to obtain the solid fit.

Preferably, the secondary sintering is performed at a temperature of 400° C. to 550° C.

Preferably, the sub-step of providing colloidal frit in the groove includes:

coating a layer of frit on the base substrate having the defining pattern formed thereon; and
scraping off redundant frit on the defining pattern.

Preferably, the packaging method further includes steps of:

assembling the packaging substrate with a substrate having the electronic device formed thereon; and
melting the solid frit, so that the packaging substrate and the substrate having the electronic device formed thereon are bonded together.

Preferably, the solid frit is irradiated with laser to melt the solid frit.

Preferably, the packaging method further includes, before the sub-step of providing colloidal frit in the groove, a sub-step of: preparing the colloidal frit, and the sub-step of preparing the colloidal frit specifically comprises:

adding organic solvent and macromolecular organics into glass powder, so as to obtain the frit having a high viscosity.

Preferably, the packaging method further includes, before the sub-step of forming a defining pattern on a base substrate, sub-steps of:

providing the base substrate; and
cleaning a surface of the base substrate.

As another aspect of the present invention, there is provided a packaging system for packaging an electronic device, wherein the packaging system includes:

a patterning apparatus for forming a defining pattern on a base substrate, wherein the defining pattern includes a groove for defining position of frit,
an adhesive application apparatus for providing colloidal frit in the groove;
a heating apparatus for heating the frit;
a polishing apparatus for polishing upper surfaces of the defining pattern and preliminarily cured frit; and
a defining pattern removing apparatus for removing the defining pattern.

Preferably, the fit is a jelly obtained by mixing glass powder with organic solvent.

Preferably, the heating apparatus is specifically used for:

heating the colloidal frit to obtain the preliminarily cured frit, heating the preliminarily cured frit to obtain solid frit, and heating the solid fit to melt the solid frit.

Preferably, the defining pattern is formed by a photoresist, the patterning apparatus includes a photoresist application device and an exposure and development device, and the defining pattern removing apparatus is a photoresist stripping apparatus.

Preferably, the photoresist application device is used for coating a layer of photoresist on the base substrate, and the exposure and development device is used for exposing and developing the photoresist, so as to obtain the defining pattern.

Preferably, the heating apparatus includes an alignment device able to align a packaging substrate with a substrate having the electronic device formed thereon, and a laser able to emit laser for heating the frit.

Preferably, the adhesive application apparatus includes an adhesive spraying device for coating a layer of frit on the base substrate having the defining pattern formed thereon, and a scraper for scraping off redundant frit on the defining pattern.

In the packaging method provided by the present invention, serrations on the surface of the preliminarily cured frit can be removed by polishing, so that the preliminarily cured frit has a smooth surface, and thus can also maintain a smooth surface after the frit is completely cured. As a result, no potential stress point forms on a substrate having an electronic device formed thereon after the substrate having the electronic device formed thereon is assembled with the packaging substrate, and thus a better packaging effect is achieved.

BRIEF DESCRIPTION OF THE DRAWINGS

The accompanying drawings, which constitute a part of the description, are used for providing a further understanding of the present invention, and explaining the present invention together with the following specific implementations, rather than limiting the present invention, in which.

DESCRIPTION OF THE PREFERRED EMBODIMENT

The specific implementations of the present invention will be described in detail below with reference to the accompanying drawings. It should be understood that the specific implementations described herein are merely used for describing and explaining the present invention and not intended to limit the present invention.

Figure 1:
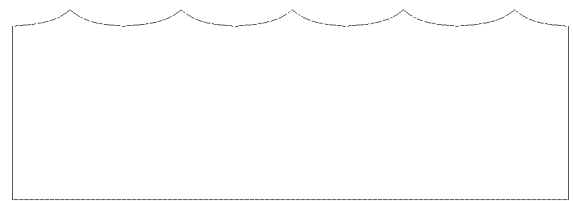
FIG. 1 is a diagram schematically illustrating a surface of cured frit in the case of packaging an electronic device by using a packaging method in the prior art.

After repeated studies, the inventor of the present invention found that the reason why an electronic device obtained by using the packaging method described in the background is prone to have a crack is that a sharp edge (as shown in FIG. 1) forms on an upper surface of the frit after the frit is cured, a potential stress point may occur when the sharp edge comes into contact with an substrate having the electronic device formed thereon, and such local stress point in the glass may become a cause for crack.

Figure 3A:
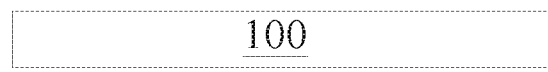
FIGS. 3(a) to 3(g) are diagrams schematically illustrating processes of a packaging method provided by the present invention.
Figure 3B:
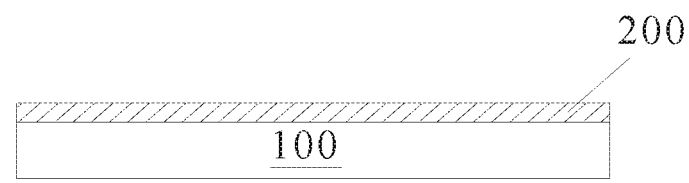
Figure 3C:
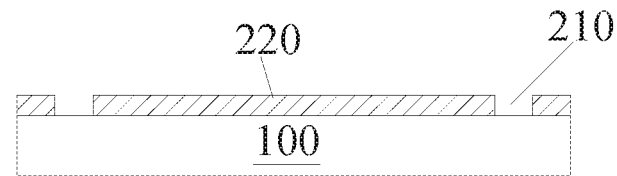
Figure 3D:
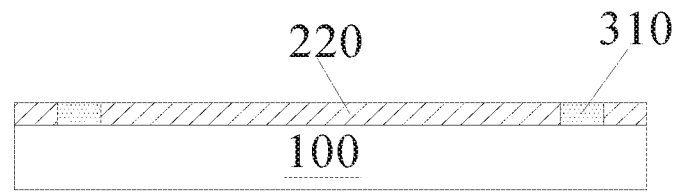
Figure 3E:
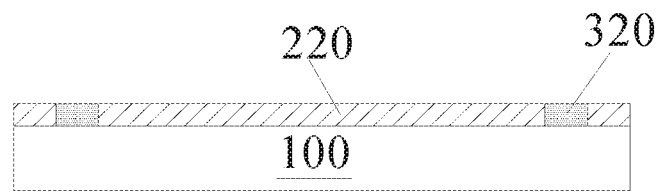
Figure 3F:
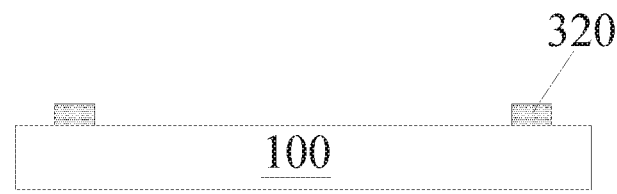
Figure 3G:
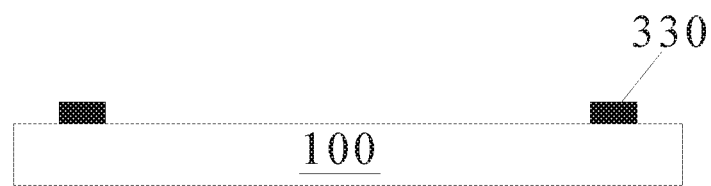

To solve the above problem, as one aspect of the present invention, there is provided a packaging method for an electronic device. As shown in FIGS. 3(c) to 3(g), the packaging method includes a step of forming a packaging substrate, and the step of forming a packaging substrate specifically includes sub-steps of:

forming, on a base substrate 100, a defining pattern 200 including a groove 210 for defining position of frit (as shown in FIG. 3(c));

providing colloidal frit 310 in the groove 210 (as shown in FIG. 3(d));

presintering the colloidal frit 310, so as to obtain preliminarily cured frit 320 (as shown in FIG. 3(e));

polishing upper surfaces of the defining pattern 220 and the preliminarily cured frit 320; and removing the defining pattern 220 (as shown in FIG. 3(f)), and completely curing the frit 320 to form solid frit 330 on the base substrate 100 (as shown in FIG. 3(g)), so that the packaging substrate is obtained.

Figure 2:
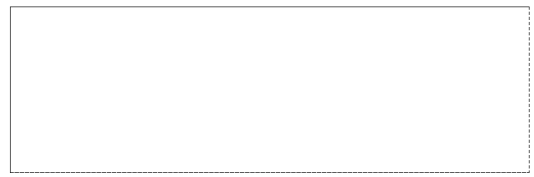
FIG. 2 is a diagram schematically illustrating a surface of cured and polished frit in the case of using a packaging method provided by the present invention.

It should be noted that, the colloidal frit 310 here is a jelly obtained by mixing glass powder with organic solvent. The organic solvent in the colloidal frit may be evaporated by presintering, so as to obtain the preliminarily cured fit 320. Serrations at the surface of the preliminarily cured frit 320 can be removed by polishing, so that the preliminarily cured frit 320 can have a smooth surface as shown in FIG. 2), and thus can maintain a smooth surface after the frit is completely cured. As a result, after the packaging substrate is assembled with a substrate having an electronic device formed thereon, no potential stress point forms on the substrate having the electronic device formed thereon, so that a better packaging effect is achieved and the resultant electronic device can hardly have a crack. The base substrate 100 may be a transparent substrate, and for example, the base substrate 100 may be a transparent glass plate.

In the present invention, the specific material and forming method of the defining pattern 220 are not particularly limited, as long as the defining pattern 220 can maintain solid without being denatured when the colloidal frit is being presintered and also maintain solid when being polished.

As a preferable implementation of the present invention, the defining pattern may be formed by a photoresist 200, and accordingly, the sub-step of forming, on a base substrate 100, a defining pattern 200 may include:

coating a layer of photoresist 200 on the base substrate 100 (as shown in FIG. 3(b)); and exposing and developing the photoresist 200 to obtain the defining pattern 220 (as shown in FIG. 3(c)).

By using the photoresist 200 to form the defining pattern 220, position of the groove 210 can be controlled accurately, and further position of the solid frit 330 on the base substrate 100 can be controlled accurately, so that the assembly accuracy can be guaranteed.

In the case that the defining pattern 220 is formed by the photoresist 200, preferably, the presintering is performed at a temperature of 100° C. to 120° C., so that complete volatilization of the organic solvent in the frit can be ensured, and deformation of the defining pattern can be prevented as well.

In the process of preparing the colloidal frit 310, not only organic solvent but also macromolecular organics are added into glass powder, in order to ensure high viscosity of the frit. To improve packaging strength, preferably, the macromolecular organics in the frit should be removed. Therefore, preferably, the sub-step of removing the defining pattern, and completely curing the preliminarily cured frit to form solid frit on the base substrate may include:

stripping off the defining pattern 220; and performing secondary sintering on the preliminarily cured frit after the defining pattern 220 is removed, so as to obtain the solid frit 330.

Preferably, the secondary sintering is performed at a temperature of 400° C. to 550° C.

In order to reduce sharp serrations on the upper surface of the preliminarily cured fit 320, preferably, the sub-step of providing colloidal frit in the groove 210 specifically includes:

coating a layer of frit on the base substrate having the defining pattern 220 formed thereon; and scraping off the redundant frit on the defining pattern 220.

After coating the layer of frit on the base substrate having the defining pattern 220 formed thereon, the colloidal frit 310 naturally flows into the groove, and the colloidal frit 310 in the groove can have a relatively smooth initial surface after the redundant colloidal frit 310 on the defining pattern 220 is scraped off with a scraper, which can reduce difficulty in the subsequent polishing process. In addition, by using the above method to provide frit, no complex device is required and the cost is relatively low.

Generally, after the packaging substrate provided with the solid frit 330 is obtained, the packaging method further includes steps of:

assembling the packaging substrate with a substrate having an electronic device formed thereon; and melting the solid frit 330, so that the packaging substrate and the substrate having the electronic device formed thereon are bonded together.

The solid frit 330 may be irradiated with laser to melt the solid frit 330, so that the packaging substrate and the substrate having the electronic device formed thereon are bonded together. It can be easily understood that, the melt frit has a large viscosity, and it generates a higher bonding strength after being re-cured than a common adhesive does. Therefore, by using the method provided by the present invention, the bonding strength between the packaging substrate and the substrate having the electronic device formed thereon can also be strengthened.

In the present invention, the specific type of the electronic device is not particularly limited, and for example, the electronic device may be an organic light emitting diode.

Preferably, the packaging method further includes steps of: providing the base substrate 100, and cleaning a surface of the base substrate 100, as shown in FIG. 3(a).

As another aspect of the present invention, there is provided a packaging system for packaging an electronic device, wherein the packaging system includes:

a patterning apparatus for forming a defining pattern 220 on a base substrate, wherein the defining pattern 220 includes a groove 210 for defining position of frit;

an adhesive application apparatus for providing colloidal frit 310 in the groove 210;

a heating apparatus for heating the frit, and specifically for heating colloidal frit 310 to obtain preliminarily cured frit 320, heating the preliminarily cured frit 320 to obtain solid frit 330, and heating the solid frit 330 to melt the solid frit 330;

a polishing apparatus for polishing upper surfaces of the defining pattern and the preliminarily cured frit 320; and a defining pattern removing apparatus for removing the defining pattern 220.

The patterning apparatus may perform the step of forming the defining pattern 220 as shown in FIGS. 3(b) and 3(c), and the adhesive application apparatus may perform the step of providing colloidal frit 310 as shown in FIG. 3(d), and the heating apparatus may be used to perform the steps of heating the colloidal frit 310 and the solid frit 330 as shown in FIGS. 3(e) and 3(g). The above apparatuses can be easily implemented, and therefore, the above packaging system provided by the present invention not only can execute the method provided by the present invention well, but also has a relatively low cost.

In the present invention, the specific structure of the polishing apparatus is not particularly limited, as long as it can polish the upper surfaces of the defining pattern 220 and the preliminarily cured frit 320. For example, the polishing apparatus may be a polishing machine.

To lower the cost, the adhesive application apparatus may include an adhesive spraying device which applies the colloidal frit 310 on the upper surface of the defining pattern 220, and a scraper with which the redundant colloidal frit 310 is scraped off.

In the case that the defining pattern 220 is formed by a photoresist, preferably, the patterning apparatus includes a photoresist application device and an exposure and development device. Accordingly, the defining pattern removing apparatus is a photoresist stripping apparatus. Here, the photoresist application device is used for coating a layer of photoresist 200 on the base substrate 100, and the exposure and development device is used for exposing and developing the photoresist 200, so as to obtain the defining pattern 220. Those skilled in the art can easily understand that a mask plate is needed during exposing and developing.

Preferably, the heating apparatus includes an alignment device and a laser, the alignment device is able to align the packaging substrate with a substrate having an electronic device formed thereon, and the laser is able to emit laser that turns colloidal frit 310 into preliminarily cured frit 320, turns the preliminarily cured frit 320 into solid frit 330, and melts the solid frit 330.

The packaging system provided by the present invention has simple structure and low cost, and can carry out the above packaging method provided by the present invention well.

It could be understood that the foregoing implementations are merely exemplary implementations for describing the principle of the present invention, but the present invention is not limited thereto. A person of ordinary skill in the art may make various modifications and improvements without departing from the spirit and essence of the present invention, and these modifications and improvements shall fall into the protection scope of the present invention.

The invention claimed is:

1. A packaging method for an electronic device, comprising a step of: forming a packaging substrate, wherein the step of forming a packaging substrate comprises sub-steps:

forming a defining pattern on a base substrate, wherein the defining pattern comprises a groove for defining position of frit;

providing colloidal frit in the groove;

presintering the colloidal frit to obtain preliminarily cured frit;

polishing upper surfaces of the defining pattern and the preliminarily cured frit; and removing the defining pattern to form solid frit on the base substrate, so that the packaging substrate is obtained.

2. The packaging method according to claim 1, wherein the sub-step of forming a defining pattern on a base substrate comprises:

coating a layer of photoresist on the base substrate; and exposing and developing the photoresist, so as to obtain the defining pattern.

3. The packaging method according to claim 1, wherein material for forming the defining pattern maintains solid without being denatured when presintering the colloidal frit, and maintains solid during polishing.

4. The packaging method according to claim 2, wherein the presintering is performed at a temperature of 100° C. to 120° C.

5. The packaging method according to claim 2, wherein the sub-step of removing the defining pattern to form solid frit on the base substrate comprises:
stripping off the defining pattern; and
performing secondary sintering on the preliminarily cured frit to obtain the solid frit.

6. The packaging method according to claim 5, wherein the secondary sintering is performed at a temperature of 400° C. to 550° C.

7. The packaging method according to claim 1, wherein the sub-step of providing colloidal frit in the groove comprises:
coating a layer of frit on the base substrate having the defining pattern formed thereon; and
scraping off redundant frit on the defining pattern.

8. The packaging method according to claim 1, wherein the packaging method further comprises steps of:
assembling the packaging substrate with a substrate having the electronic device formed thereon; and
melting the solid frit, so that the packaging substrate and the substrate having the electronic device formed thereon are bonded together.

9. The packaging method according to claim 8, wherein the solid frit is irradiated with laser to melt the solid frit.

10. The packaging method according to claim 1, further comprising, before the sub-step of providing colloidal frit in the groove, a sub-step of: preparing the colloidal frit, wherein the sub-step of preparing the colloidal frit specifically comprises:
adding organic solvent and macromolecular organics into glass powder, to obtain the frit having a high viscosity.

11. The packaging method according to claim 1, further comprising, before the sub-step of forming a defining pattern on a base substrate, sub-steps of:
providing the base substrate; and
cleaning a surface of the base substrate.

12. A packaging system for packaging an electronic device, comprising:
a patterning apparatus for forming a defining pattern on a base substrate, wherein the defining pattern comprises a groove for defining position of frit;
an adhesive application apparatus for providing colloidal frit in the groove;
a heating apparatus for heating the frit;
a polishing apparatus for polishing upper surfaces of the defining pattern and preliminarily cured frit; and
a defining pattern removing apparatus for removing the defining pattern.

13. The packaging system according to claim 12, wherein the frit is a jelly obtained by mixing glass powder with organic solvent.

14. The packaging system according to claim 12, wherein the heating apparatus is specifically used for:
heating the colloidal frit to obtain the preliminarily cured frit, heating the preliminarily cured frit to obtain solid frit, and heating the solid frit to melt the solid frit.

15. The packaging system according to claim 12, wherein the defining pattern is formed by a photoresist, the patterning apparatus comprises a photoresist application device and an exposure and development device, and the defining pattern removing apparatus is a photoresist stripping apparatus.

16. The packaging system according to claim 15, wherein the photoresist application device is used for coating a layer of photoresist on the base substrate, and the exposure and development device is used for exposing and developing the photoresist, so as to obtain the defining pattern.

17. The packaging system according to claim 12, wherein the heating apparatus comprises an alignment device able to align a packaging substrate with a substrate having the electronic device formed thereon, and a laser able to emit laser for heating the frit.

18. The packaging system according to claim 12, wherein the adhesive application apparatus comprises an adhesive spraying device for coating a layer of frit on the base substrate having the defining pattern formed thereon, and a scraper for scraping off redundant frit on the defining pattern.

19. The packaging system according to claim 13, wherein the heating apparatus is specifically used for:
heating the colloidal frit to obtain the preliminarily cured frit, heating the preliminarily cured frit to obtain solid frit, and heating the solid frit to melt the solid frit.

20. The packaging system according to claim 19, wherein the defining pattern is formed by a photoresist, the patterning apparatus comprises a photoresist application device and an exposure and development device, and the defining pattern removing apparatus is a photoresist stripping apparatus.

* * * * *